United States Patent [19]

Iida et al.

[11] 3,991,382
[45] Nov. 9, 1976

[54] OSCILLATION FREQUENCY CONTROL DEVICE FOR A LOCAL OSCILLATOR

[75] Inventors: Hiroshi Iida, Machida; Yukihiro Endo, Akishima, both of Japan

[73] Assignee: Sansui Electric Co., Ltd., Tokyo, Japan

[22] Filed: June 10, 1975

[21] Appl. No.: 585,490

[30] Foreign Application Priority Data

June 11, 1974 Japan.......................... 49-66965[U]

[52] U.S. Cl................................ 331/14; 331/16; 331/17
[51] Int. Cl.$^2$.......................................... H03B 3/08
[58] Field of Search ................ 331/1 A, 14, 16, 17, 331/30

[56] References Cited
UNITED STATES PATENTS

| | | | |
|---|---|---|---|
| 3,185,938 | 5/1965 | Pelosi.................... | 331/14 |
| 3,504,294 | 3/1970 | Martin, Jr. ............ | 331/1 A |
| 3,644,840 | 2/1972 | Conner................. | 331/1 A |
| 3,710,274 | 1/1973 | Basse.................... | 331/14 |
| 3,753,141 | 8/1973 | Elk et al. .............. | 331/1 A |
| 3,806,825 | 4/1974 | Schlosser.............. | 331/1 A |
| 3,806,826 | 4/1974 | Schlosser.............. | 331/1 A |

*Primary Examiner*—John Kominski
*Attorney, Agent, or Firm*—Flynn & Frishauf

[57] ABSTRACT

An oscillation frequency control device which comprises a voltage control local oscillator; a generator for giving forth an output having a predetermined referential frequency; means for periodically generating a gate pulse whose time width is equal to an integral multiple of the period of an output signal from said generator; a gate circuit for permitting the passage of an output signal from the local oscillator only during the time width of said gate pulse, wherein, while the local oscillator continues oscillation at a desired frequency, the number k of waves running through the gate circuit is chosen to be equal to an integral multiple of the counting capacity or the scale type n of a counter; said n-scale counter counts signals which have traveled through the gate circuit in at least one cycle for each supply period of the gate pulse, starting with the prescribed count at which said counter is initially reset; a count obtained in the final cycle is changed into an analog signal; comparison is made between a voltage represented by said analog signal and the referential voltage corresponding to the prescribed count at which the counter is initially reset; a differential voltage resulting from the outcome of said comparison is fed back to the local oscillator as a control voltage, thereby causing said oscillator to carry out oscillation only at desired frequencies.

5 Claims, 3 Drawing Figures

OSCILLATION FREQUENCY CONTROL DEVICE FOR A LOCAL OSCILLATOR

BACKGROUND OF THE INVENTION

This invention relates to a device for precisely controlling the frequency of a local oscillator and more particularly to a device for controlling the frequency of a voltage control local oscillator by detecting the frequency of an output signal therefrom and thereby effecting voltage control by an output of said detection.

Where an attempt is made to receive FM broadcast waves of a given channel, the general practice is to operate a variable condenser in the case of a prior tuner so as to continuously vary the frequency of a local oscillator included in said tuner, thereby attaining tuning with the desired channel. Though this procedure can indeed realize tuning, yet it does not necessarily follow that an intermediate frequency obtained coincides with the prescribed intermediate frequency. Therefore, errors are likely to take place in the attempted tuning.

In general, the frequencies of broadcast waves of various channels are specified in units of a prescribed step or interval. In Japan, for example, the frequencies of the respective FM broadcast waves are specified in units of 100 kHz. Since, the frequency of FM broadcast waves of any desired channel consists of a known multiple of 100 kHz units allotted thereto, it is unnecessary to vary the frequency of a local oscillation as often as need arises. What is required is only to cause the local oscillator to oscillate exactly at the frequency allotted to any desired FM channel in order to obtain any desired intermediate frequency, and carry out reception without tuning errors.

It is accordingly the object of this invention to provide an oscillation frequency control device which enables a local oscillator included in a tuner to oscillate only at a frequency allotted to any desired channel.

SUMMARY OF THE INVENTION

The oscillation frequency control device of this invention comprises a local oscillator whose frequency varies with a control voltage impressed; a referential frequency oscillator; means coupled to said referential frequency oscillator so as to periodically generate a gate pulse whose time width is equal to an integral multiple of the period of an output signal from said referential frequency oscillator; a gate circuit which opens the gate while a gate pulse is received, and permits the passage of an output signal from said local oscillator or a signal obtained by beating down said output signal only during a period corresponding to the time width of the gate pulse; a counter for counting signals which have traveled through the gate circuit in at least one cycle for each supply period of the gate pulse, starting with a prescribed count at which the counter is initially reset; a digital-analog converter for converting a count made by the counter in the final cycle into an analog signal; means for comparing a referential voltage corresponding to the count at which the counter is initially reset with a voltage represented by an output signal from said digital-analog converter and feeding a signal denoting a difference between said both voltages back to the local oscillator as a control voltage; and means for resetting the counter at the predetermined count while the gate of the gate circuit is closed.

With the oscillation frequency control device of this invention, the local oscillator includes means for preliminarily tuning a receiver with any desired broadcast waves, for example, a variable condenser and means for automatically changing the preliminarily tuned frequency of the local oscillator into a precisely tuned frequency, for example, a variable capacitance diode.

According to this invention, the time width of the gate pulse is chosen to be an integral multiple of the period of an output signal from the referential frequency oscillator, thereby making a number $k$ of waves passing through the gate circuit while the local oscillator continues to oscillate at a predetermined frequency equal to an integral multiple of the counting capacity or scale type $n$ of the counter. The counter actually carries out counting in a plurality of cycles during the time width of each gate pulse. A count obtained in the final cycle is converted into an analog signal. Comparison is made between a voltage represented by said analog signal and said predetermined referential voltage. A signal denoting a difference between said both voltages is fed back to the local oscillator. The frequency of the local oscillator is controlled until said differential voltage is brought to zero. The count made by the counter in the final cycle remains unchanged throughout every stage of measurement, as long as the local oscillator continues oscillation at a predetermined frequency. When, therefore, comparison is made between a voltage denoted by an analog signal into which the count made by the counter in the final cycle was converted and the referential voltage corresponding to the count at which the counter is initially reset, then precise control can be made of the frequency of the local oscillator throughout every stage of measurement. To effect the above-mentioned comparison, analog signals representing the final cycle counts in the respective stages of measurement are preferred to retain linearity over as broad a range as possible. For the object of this invention, the counter should have its content reset at a predetermined count state when commencing the counting of signals passing through the gate circuit. The count of the count state at which the counter is initially reset is desired to be substantially equal to half the capacity or scale of the counter.

DETAILED DESCRIPTION OF THE INVENTION

Figure 1:
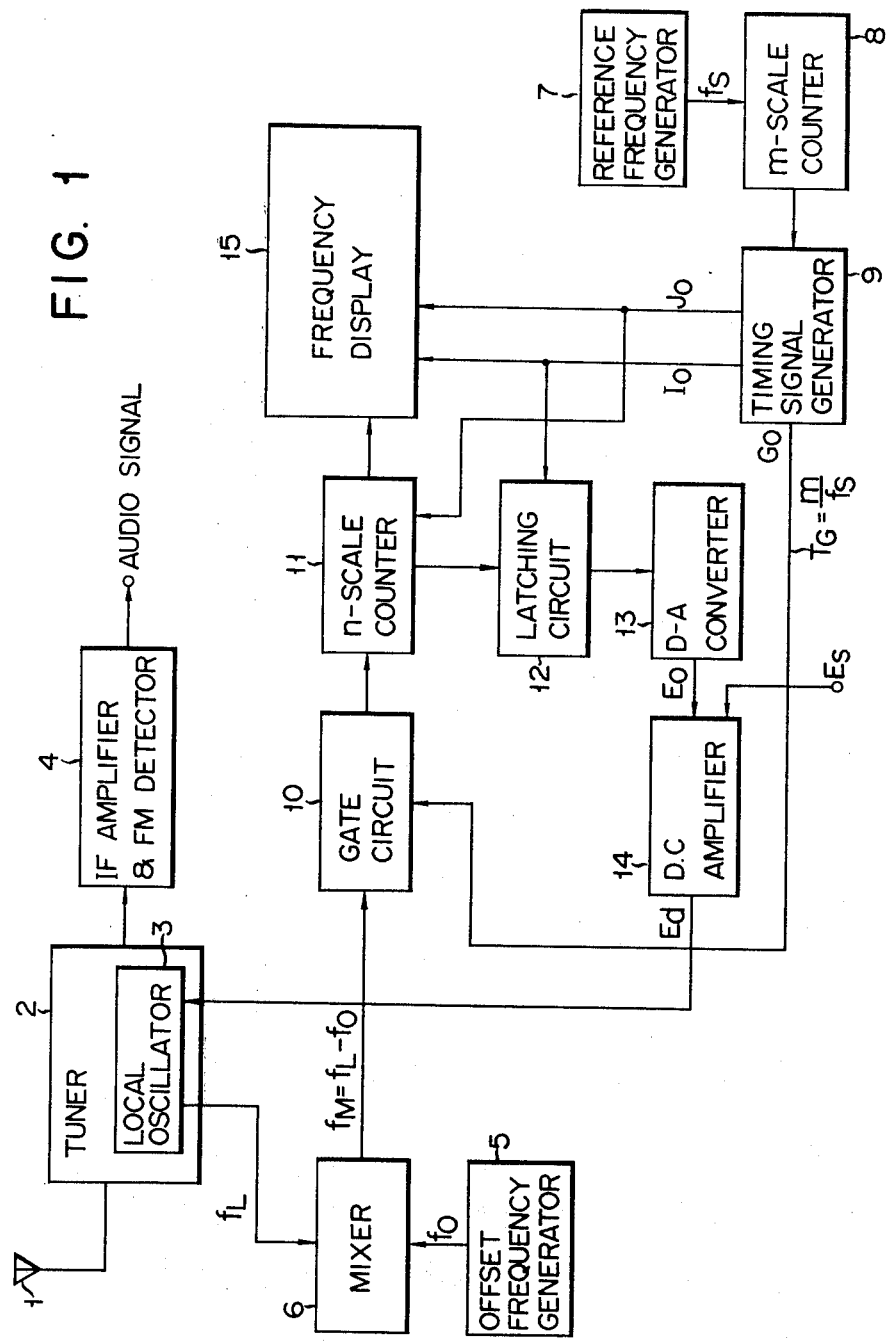
FIG. 1 is a block circuit diagram of an oscillation frequency control device embodying this invention.

Referring to FIG. 1, a receiver tuner 2 coupled to an antenna 1 includes a local oscillator 3. An output signal of intermediate frequency delivered from the tuner 2 passes through an intermediate frequency amplifier and modulated frequency detector 4 to be given forth as an audio signal. The local oscillator 3 includes a variable condenser for preliminarily controlling the frequency of said local oscillator 3 so as to receive a broadcast wave of a desired frequency and a variable capacitance diode for precise control of said oscillation frequency. A mixer 6 is provided to mix the frequency $f_L$ of the local oscillator 3 and the frequency $f_O$ of an output signal from an offset frequency generator 5 to provide a beaten down frequency $f_M$ denoted by $f_M = f_L - f_O$. There is further provided a referential frequency oscillator, for example, a quartz oscillator 7 to provide an oscillation frequency $f_S$, which is defined in consideration of the interval frequency by which the frequencies of broadcast waves of various channels are separated from each other (said oscillation frequency $f_S$ need not be exactly equal to said interval frequency). The frequency $f_S$ of an output signal from the quartz oscillator 7 is counted by a counter 8 of an $m$ scale or having a capacity $m$. An output signal from said $m$ scale counter is supplied to a timing signal generator 9 for producing a timing signal. Upon receipt of an output signal from the $m$ scale counter, the timing signal generator 9 gives forth a signal $G_o$ containing a gate pulse having a time width $m$ times the period of the oscillation frequency $f_S$, a reset signal $J_O$ containing a reset pulse and a latch signal $I_o$ containing a latch pulse. A gate circuit 10 opens its gate while the gate pulse is received and conducts an output signal $f_M$ from the mixer 6 therethrough to a counter 11 of an $n$ scale or having a capacity $n$. An output signal from this $n$ scale counter 11 is sent forth to a digital-analog converter 13 through a latch circuit 12 for conversion into an analog signal $E_O$.

The later described referential voltage $E_s$ and a voltage $E_O$ represented by said analog signal are compared with each other in a D.C. amplifier 14, which in turn gives forth an output signal $E_d$ denoting a difference between said both voltages $E_s$, $E_o$. The differential voltage $E_d$ is fed back to a variable capacitance diode (not shown) included in the local oscillator 3 as a control voltage. The reset signal $J_O$ is delivered to the $n$ scale counter to reset it at a predetermined count. The latch signal $I_o$ is supplied to operate the latch circuit 12. To watch the current frequency of the local oscillator 3, a frequency indicator 15 may be provided, if necessary. This frequency indicator 15 is supplied with output signals from the $n$ scale counter 11, reset signal $J_O$ and latch signal $I_o$.

Figure 2:
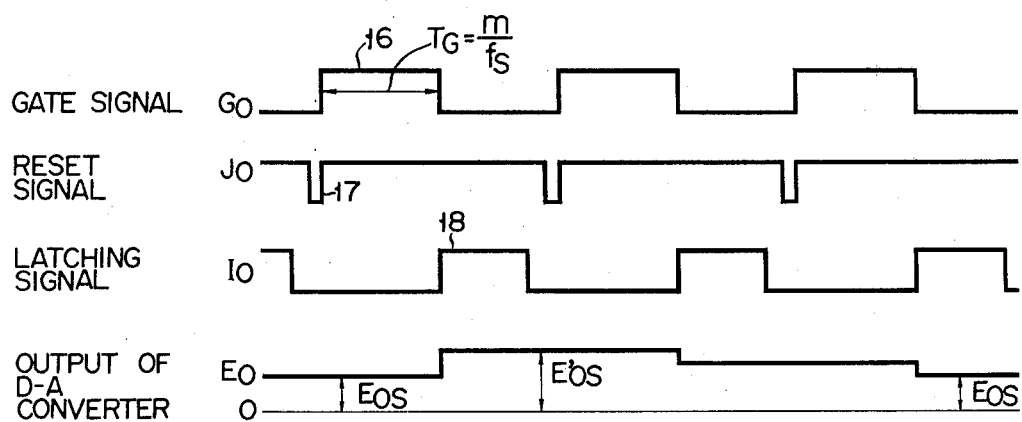
FIG. 2 shows wave forms illustrating the operation of the circuit of FIG. 1.

There will now be described by reference to FIGS. 2 and 3 the operation of the oscillation frequency control device of this invention shown in FIG. 1. FIG. 2 presents the gate signal $G_O$, the gate pulse 16 of which is assumed to be periodically given forth in a time width of $T_G = m/f_S$. The negative reset pulse 17 of the reset signal $J_O$ is indicated as being generated immediately before the issue of said gate pulse 16. The latch pulse 18 of the latch signal $I_o$ is shown as being produced immediately after the generation of the gate pulse 16.

Where the $n$ scale counter 11 is, for example, of a 6-bit type, its binary output signal may be expressed as follows relative to a decimal input.

| Decimal input | $2^0$ | $2^1$ | $2^2$ | $2^3$ | $2^4$ | $2^5$ |
|---|---|---|---|---|---|---|
| 0 or 64 | 0 | 0 | 0 | 0 | 0 | 0 |
| 1 | 1 | 0 | 0 | 0 | 0 | 0 |
| . | . | | | | | |
| . | . | | | | | |
| 31 | 1 | 1 | 1 | 1 | 1 | 0 |
| . | . | | | | | |
| . | . | | | | | |
| 63 | 1 | 1 | 1 | 1 | 1 | 1 |

Now let it be assumed that when the $n$ scale counter 11 receives the reset pulse 17 of the reset signal $J_O$ from the timing signal generator 9 immediately before the issue of the gate pulse 16, said counter 11 is so designed as to be reset at a count expressed in the binary form of (1,1,1,1,1,0) which corresponds to, for example, a decimal input of 31. Then, the counter 11 commences counting from the count at which it is initially reset, and counts input pulses in a plurality of cycles, in each case up to its capacity. A binary output signal supplied from said counter 11 when it is reset at said prescribed count is converted into an analog signal by the digital-analog converter 13. The resultant D.C. output signal is designated as $E_{OS}$. Then the referential voltage $E_s$ is chosen to have a value equal to said D.C. output signal $E_{OS}$.

A signal having a frequency $f_M$ which was beaten down by an offset signal having a frequency $f_O$ in the mixer 6 passes through the gate circuit 10 during a period represented by the time width $T_G$ of the gate pulse 16. The number of signals having said frequency $f_M$ which have traveled through the gate circuit 10 is counted, starting with the aforesaid count at which the counter 11 is reset. When the generation of the gate pulse 16 is brought to an end, the counter 11 stops counting. Immediately afterward, the timing signal generator 9 supplies the latch pulse 18 of the latch signal $I_o$ to the latch circuit 12, causing the count made in the final cycle to be stored in said latch circuit 12. The final cycle count is stored therein until the counter 11 completes the succeeding counting cycle. During this period, the stored final cycle count is conducted to the digital-analog converter 13 for conversion into a voltage represented by the resultant analog signal.

Figure 3:
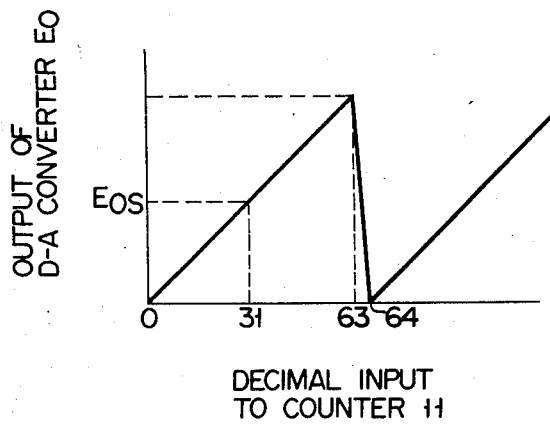
FIG. 3 is a line diagram showing the relationship between a decimal input to the n-scale counter of FIG. 1 and an output voltage from a digital-analog converter, particularly indicating a voltage represented by an analog signal into which a final cycle count is converted in comparison with a voltage corresponding to the count at which the counter is initially reset.

Where, in this case, the final cycle count coincides with the count of 31 at which the counter 11 is reset, then an output signal $E_O$ from the digital-analog converter 13 is changed into $E_{OS}$ (FIG. 3). The voltage of said output signal $E_{OS}$ becomes equal to the referential voltage $E_s$, thus bringing a voltage denoted by an output signal $E_d$ from the D.C. amplifier 14 to zero. This means that the local oscillator 3 has been operated at a predetermined frequency.

There will now be another case where the count made by the counter 11 in the final cycle indicates, for example, a decimal number of 35. At this time, a binary output signal from the counter 11 is represented by 1,1,0,0,0,1 on the aforesaid 6-bit basis. This binary signal denoting the count of 35 passes through the latch circuit 12 and digital-analog converter 13 for conversion into an analog signal $E_{OS'}$. Since the voltage of said analog signal $E_{OS'}$ is higher than that of the output signal $E_{OS}$, a signal $E_d$ representing a difference between said both voltages is impressed on the variable capacity diode of the local oscillator 3, reducing the frequency of the local oscillator 3 until the voltage of the signal $E_{OS'}$ is made equal to that of the signal $E_{OS}$. This control operation is repeated until the final cycle count falls to the count of 31 at which the counter is reset. While the above-mentioned control operation is repeated, the digital-analog converter 13 produces an output signal $E_O$ as illustrated in the fourth picture of FIG. 2.

There will now be further described the requisite conditions for this invention which enables the local oscillator to carry out oscillation at the interval frequency by which the frequencies of broadcast waves of various channels are separated from each other. The time width $T_G$ of the gate pulse 16 is expressed as $T_G = m/f_S$ as previously described. Now let it be assumed that with k taken to denote the number of signal waves from the mixer 6 which have passed through the gate circuit 10 during the time width $T_G$ of the gate pulse 16 and n taken to represent the counting capacity or scale of the counter 11, the ratio N of k to n has an integral value. Then upon completion of counting, the counter 11 has its count brought back to a state of (1,1,1,1,1,0) equivalent to 31 received as a decimal input at which said counter is reset. If N is not an integer, it shows that the counter 11 made a different count in the final cycle from that obtained when the counter was previously reset. In such case, an output signal $E_d$ from the D.C. amplifier 14 controls the frequency of the local oscillator 3 until N takes an integral value. With the frequency $f_M$ of an output signal from the mixer 6 assumed to have a value of $f_L - f_O$ and the period of said frequency $f_M$ designated as $T_M$, the following equation results:

$$k = T_G/T_M = m/f_S \times f_M = (m/f_S)(f_L - f_O) \quad (1)$$

Since $k = n, N$, the following equation is obtained $$f_L - f_O = (n/m).N.f_S \quad (2)$$

Now let it be assumed that the local oscillator 3 oscillates at a frequency $f_L$ which stepwise increases as $f_O+$ 100 kHz, $f_O+$ 200 kHz, $f_O+$ 300 kHz . . . with an interval of 100 kHz, and $f_O, f_S, n$ and $m$ are so defined as to cause N of the equation (2) above to indicate 1 in case of $f_L = f_O+$ 100 kHz, then the following equation results:

$$n/m \cdot f_S = 100 \quad (3)$$

In case of $n/m = 1$, therefore, it is advised to adopt a referential oscillation frequency of 100 kHz. In case of $n/m = 2$, it is advised to use a referential oscillation frequency of 50 kHz which corresponds to half the above-mentioned interval frequency of 100 kHz. Where the local oscillator oscillates at a frequency $f_L$ which stepwise increases as $f_O+$ 200 kHz, $f_O+$ 300 kHz . . . , then N denotes 2,3, . . . in the respective cases, permitting the establishment of the equation (3) above. Thus the local oscillator 3 can be made to oscillate at a frequency which progressively increases only by a prescribed step or interval. In other words, if the relationships between $n, m$ and $f_S$ are so chosen as to meet the prescribed conditions, then the object of this invention can be attained.

It is possible to supply the gate circuit 10 with an output signal from the local oscillator which lacks the offset frequency generator 5 and mixer 6 used in the foregoing embodiment. In this case, it is obviously advised to cause $f_O$ in the equations (1) and (2) to have a value of zero.

What we claim is:

1. An oscillation frequency control device for a local oscillator which comprises:

a local oscillator having first means for preliminarily controlling the output frequency thereof and second means for precisely controlling the preliminarily controlled output frequency in response to a value of a control voltage impressed thereto;

a reference frequency oscillator;

means coupled to said reference frequency oscillator so as to periodically generate a gate pulse having a time width equal to an integral multiple of the period of an output signal from said reference frequency oscillator;

a gate circuit coupled to said gate pulse generator, and whose gate is opened while the gate pulse is received and which is further coupled to pass a signal having a frequency corresponding to that of the output from said local oscillator only during the time width of the gate pulse;

a counter coupled to said gate circuit for counting the signals which have traveled through said gate circuit in at least one cycle for each supply period of the gate pulse, starting with a predetermined count state at which said counter is reset;

a digital-analog converter coupled to said counter for converting the count made by said counter in the final cycle into an analog signal;

means for comparing a reference voltage corresponding to the count of said predetermined count state at which said counter is reset with a voltage represented by an output analog signal from said digital-analog converter and feeding a signal denoting a difference between said both voltages back to said local oscillator as said control voltage; and means for resetting said counter at said predetermined count state while said gate circuit is in the closed condition, whereby said local oscillator is so controlled as to oscillate at a frequency which progressively increases only by a prescribed interval.

2. An oscillation frequency control device according to claim 1, wherein the count of said predetermined count state at which said counter is reset corresponds to substantially half the capacity of said counter.

3. A oscillation frequency control device for a local oscillator which comprises:

a local oscillator having first means for preliminarily controlling the output frequency thereof and second means for precisely controlling the preliminarily controlled output frequency in response to a value of a control voltage impressed thereto;

a reference frequency oscillator;

a first counter coupled to said reference frequency oscillator for counting output signals from said reference frequency oscillator;

a timing signal generator coupled to said first counter so as to periodically generate a gate pulse and a latch pulse, said gate pulse having a time width equal to an integral multiple of the period of an output signal of said reference frequency oscillator;

a gate circuit coupled to said timing signal generator, and whose gate is opened while said gate pulse is received and which is further coupled to pass a signal having a frequency corresponding to that of the output from said local oscillator only during the time width of the gate pulse;

a second counter coupled to said gate circuit for counting signals which have run through said gate circuit in at least one cycle for each supply period of the gate pulse, starting with the predetermined count state at which the counter is reset by a reset pulse;

a latch circuit coupled to said second counter for temporarily storing the count made by said second counter in the final cycle;

a digital-analog converter coupled to said latch circuit for converting an output signal from said latch circuit into an analog signal; and means for comparing a reference voltage corresponding to the count of said predetermined count state at which said second counter is reset with a voltage represented by an output signal from said digital-analog converter and feeding a signal denoting a difference between said both voltages back to said local oscillator as said control voltage.

4. An oscillation frequency control device according to claim 3, wherein an output signal from said local oscillator is directly supplied to said gate circuit and comprises said signal having said frequency corresponding to that of the output from said local oscillator, and with $f_L$ denoting the prescribed frequency of the output from said local oscillator, said first counter being an m scale type, said second counter being an $n$ scale type, and $f_S$ representing the frequency of an output signal from said reference frequency oscillator, said parameters $f_L$, $f_S$, $m$ and $n$ having values such that a term $f_L/f_S \cdot m/n$ has an integral value.

5. An oscillation frequency control device according to claim 3, comprising:

an offset frequency generator;

means for beating down an output signal from said local oscillator by an output signal from said offset frequency generator for producing an offset signal at a frequency of $f_0$; and means for coupling said offset signal having said frequency $f_0$ to said gate circuit, said offset signal having said frequency $f_0$ comprising said signal having said frequency corresponding to that of the output from said local oscillator; and with $f_L$ denoting the prescribed frequency of the local oscillator, said first counter being an $m$ scale type, said second counter being an n scale type and $f_S$ representing the frequency of an output signal from the referential frequency oscillator, said parameters $f_L$, $f_0$, $f_S$, $m$ and $n$ having values such that a term $(f_L - f_0)/f_S \cdot m/n$ has an integral value.

* * * * *